US011326250B2

(12) United States Patent
Kirkpatrick

(10) Patent No.: US 11,326,250 B2
(45) Date of Patent: May 10, 2022

(54) METHOD OF MAKING A FIBROUS PART USING SLOTTED SEAL PLATES AND SLOTTED PREFORMS FOR CHEMICAL VAPOR DEPOSITION DENSIFICATION

(71) Applicant: GOODRICH CORPORATION, Charlotte, NC (US)

(72) Inventor: Christopher T. Kirkpatrick, Pueblo, CO (US)

(73) Assignee: Goodrich Corporation, Charlotte, NC (US)

(*) Notice: Subject to any disclaimer, the term of this patent is extended or adjusted under 35 U.S.C. 154(b) by 267 days.

(21) Appl. No.: 16/684,301

(22) Filed: Nov. 14, 2019

(65) Prior Publication Data

US 2020/0080195 A1    Mar. 12, 2020

Related U.S. Application Data

(62) Division of application No. 15/803,535, filed on Nov. 3, 2017, now Pat. No. 10,508,334, which is a division of application No. 14/713,377, filed on May 15, 2015, now Pat. No. 9,834,842.

(51) Int. Cl.
  *C23C 16/04*  (2006.01)
  *F16D 65/12*  (2006.01)
  *F16D 65/02*  (2006.01)

(52) U.S. Cl.
  CPC .......... *C23C 16/045* (2013.01); *F16D 65/126* (2013.01); *F16D 2065/132* (2013.01)

(58) Field of Classification Search
  CPC .................... F16D 65/126; F16D 2065/132

USPC ....................................... 427/248.1
See application file for complete search history.

(56) References Cited

U.S. PATENT DOCUMENTS

| 2,631,732 | A  |   | 3/1953 | Vocelka |
|-----------|----|---|--------|---------|
| 5,900,297 | A  | * | 5/1999 | Rudolph ........... C23C 16/45557 428/66.2 |
| 7,060,134 | B2 |   | 6/2006 | Messier |
| 7,182,980 | B2 |   | 2/2007 | Goujard et al. |
| 7,335,397 | B2 |   | 2/2008 | Rudolph et al. |
| 7,691,440 | B2 |   | 4/2010 | Bernard et al. |
| 7,892,646 | B1 |   | 2/2011 | Rudolph et al. |

(Continued)

FOREIGN PATENT DOCUMENTS

EP    2993162    3/2016

OTHER PUBLICATIONS

Extended European Search Report dated Aug. 29, 2016 in European Application No. 16169893.1.

(Continued)

*Primary Examiner* — Brent T O'Hern
(74) *Attorney, Agent, or Firm* — Snell & Wilmer L.L.P.

(57) ABSTRACT

A method of making a fibrous part is provided. The method may comprise forming a porous structure with an annular geometry. A first entrance channel and a second entrance channel may be formed with the entrance channels defined by a surface of the preform. The entrance channels may also extend in a radial direction from an inner diameter of the annular porous structure partially across the surface. An exit channel may be formed between the entrance channels and defined by the surface. The exit channel may extend in a radial direction from an outer diameter of the annular porous structure partially across the surface.

6 Claims, 7 Drawing Sheets

(56) References Cited

U.S. PATENT DOCUMENTS 9,834,842 B2 * 12/2017 Kirkpatrick .......... F16D 65/126
2016/0333470 A1 11/2016 Kirkpatrick

OTHER PUBLICATIONS

USPTO; Restriction Requirement Office Action dated Apr. 4, 2017 in U.S. Appl. No. 14/713,377.
USPTO; Non-Final Office Action dated Jun. 12, 2017 in U.S. Appl. No. 14/713,377.
USPTO; Notice of Allowance dated Sep. 26, 2017 in U.S. Appl. No. 14/713,377.
European Patent Office, European Office Action dated May 23, 2018 in Application No. 16169893.1-1103.
USPTO; Pre-Interview First Office Action dated Jul. 12, 19 in U.S. Appl. No. 15/803,535.
USPTO; Notice of Allowance dated Aug. 22, 2019 in U.S. Appl. No. 15/803,535.

* cited by examiner

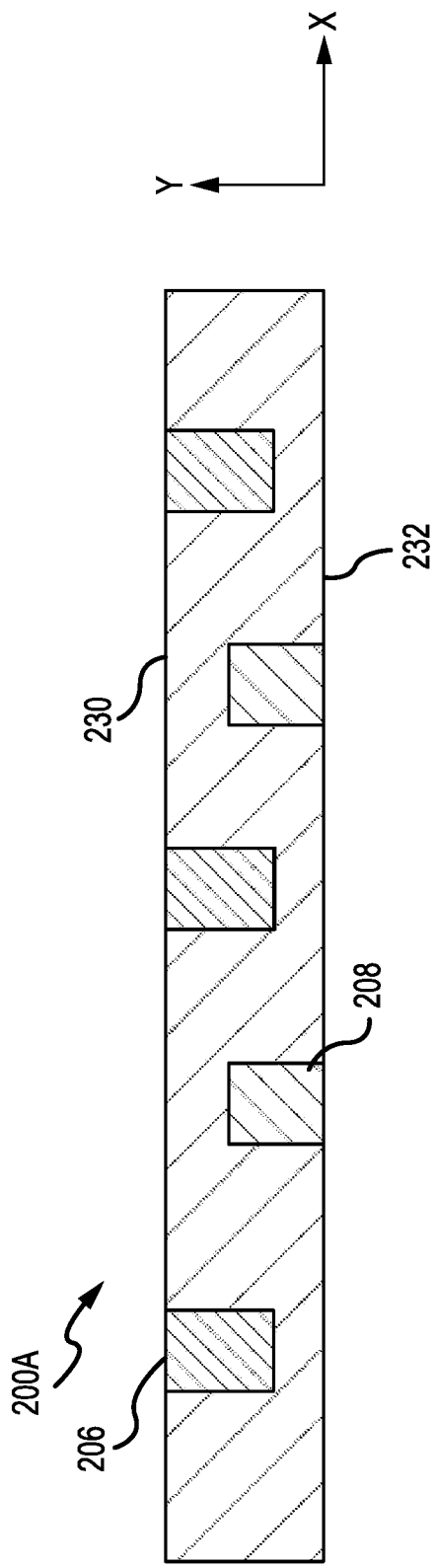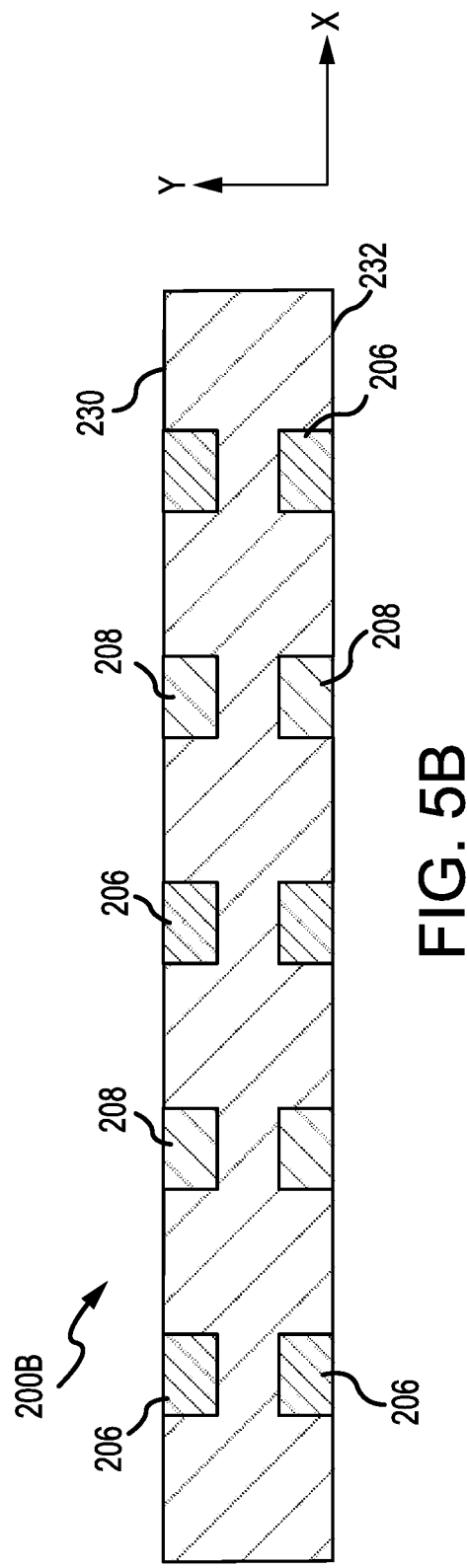

METHOD OF MAKING A FIBROUS PART USING SLOTTED SEAL PLATES AND SLOTTED PREFORMS FOR CHEMICAL VAPOR DEPOSITION DENSIFICATION

CROSS REFERENCES TO RELATED APPLICATIONS

This application is a divisional of and claims priority to U.S. application Ser. No. 15/803,535, filed Nov. 3, 2017, now U.S. Pat. 10,508,334, issued Dec. 17, 2019, and titled "SLOTTED SEAL PLATES AND SLOTTED PREFORMS FOR CHEMICAL VAPOR DEPOSITION DENSIFICATION" (the '535 application). The '535 application is a divisional of and claims priority to U.S. application Ser. No. 14/713,377, filed May 15, 2015, now U.S. Pat. No. 9,834,842, issued Dec. 5, 2017, and titled "SLOTTED SEAL PLATES AND SLOTTED PREFORMS FOR CHEMICAL VAPOR DEPOSITION DENSIFICATION" (the '377 application). The '535 application and the '377 application are incorporated herein by reference in their entirety for all purposes.

FIELD OF INVENTION

The present disclosure relates to composite brakes, and, more specifically, to slotted seal plates and slotted preforms for chemical vapor deposition densification.

BACKGROUND

Chemical vapor infiltration and deposition (CVI/CVD) is a known process for making composite structures such as carbon/carbon brake disks. The CVI/CVD process typically used for making carbon/carbon brake disks may involve passing a reactant gas or gas mixture (e.g., methane, propane, etc.) around heated porous structures (e.g., carbonized preforms) with a pressure differential driving the gas mixture into the porous structures. The gas enters into the porous structures, driven by pressure gradients, and undergoes a reaction such as thermal decomposition, hydrogen reduction, co-reduction, oxidation, carbidization, or nitridation to deposit a binding matrix.

Depending on CVI/CVD methodology and conditions, the porous structure may not densify at a uniform rate across the thickness of a porous structure, may not form a desired microstructure, and may be associated with long processing times. Thus, creation of uniformly densified porous structures may be impaired using conventional systems and methods.

SUMMARY

According to various embodiments, a method of making a fibrous part may comprise forming a porous structure with an annular geometry. An entrance channel may be formed with the entrance channels defined by a surface of the preform. The entrance channel may also extend in a radial direction from an inner diameter of the annular porous structure partially across the surface. An exit channel may be defined by the surface. The exit channel may extend in a radial direction from an outer diameter of the annular porous structure partially across the surface.

In various embodiments, the method may comprise densifying the porous structure using a pressure gradient chemical vapor deposition process. The method may also comprise the steps of pressing a channel into a second surface of the porous structure, stacking a second porous structure over the first porous structure, and/or disposing a seal plate between the first porous structure and the second porous structure. A second exit channel may be formed in a surface of the second porous structure. The surface of the first porous structure may be stacked against the surface of the second porous structure with the second exit channel and the entrance channel staggered. A gas may be urged into the entrance channel, through the porous structure, and out the exit channel. The method may also include the steps of using a high-flow chemical deposition process to densify the porous structure and using a thermal gradient chemical deposition process to densify the porous structure.

According to various embodiments, a method of making a fibrous part may comprise placing a composite part having an annular geometry into a chemical vapor infiltration (CVI) vessel, and placing a seal plate over a surface of the composite part. The seal plate may comprise an entrance channel in a surface of the seal plate and extending in a radial direction from an inner diameter of the seal plate partially across the surface. The seal plate may also comprise an exit channel defined by the surface and extending in a radial direction from an outer diameter of the seal plate partially across the surface.

In various embodiments, the method may include densifying the porous structure using a pressure gradient chemical vapor deposition process. A gas may be urged into the first entrance channel, through the porous structure, and out the exit channel. A high-flow chemical deposition process may be used to densify the porous structure. A thermal gradient chemical deposition process may also be used to densify the porous structure. A second porous structure may be placed in the vessel with the seal plate between the first porous structure and the second porous structure.

According to various embodiments, a fibrous part may comprise a porous structure having an annular geometry. A surface of the porous structure may define a first entrance channel that extends in a radial direction from an inner diameter of the porous structure partially across the surface. The surface may also define an exit channel that extends in the radial direction from an outer diameter of the porous structure partially across the surface.

In various embodiments, the porous structure may comprise layers. The layers may be bonded together using a chemical vapor infiltration (CVI) process. A second entrance channel may be defined by the surface of the porous structure. The second entrance channel may extend in the radial direction from the inner diameter of the porous structure partially across the surface. The exit channel may be disposed between the first entrance channel and the second entrance channel.

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by refer

FIG. 5A illustrates a channel arrangement with entry channels and exit channels staggered and disposed on opposite surfaces of an annular preform, in accordance with various embodiments;

FIG. 5B illustrates a channel arrangement with entry channels aligned with entry channels in an axial direction and exit channels aligned with exit channels in the axial direction, in accordance with various embodiments;

DETAILED DESCRIPTION

The detailed description of exemplary embodiments herein makes reference to the accompanying drawings, which show exemplary embodiments by way of illustration. While these exemplary embodiments are described in sufficient detail to enable those skilled in the art to practice the exemplary embodiments of the disclosure, it should be understood that other embodiments may be realized and that logical changes and adaptations in design and construction may be made in accordance with this disclosure and the teachings herein. Thus, the detailed description herein is presented for purposes of illustration only and not limitation. The steps recited in any of the method or process descriptions may be executed in any order and are not necessarily limited to the order presented.

Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact. Surface shading lines may be used throughout the figures to denote different parts but not necessarily to denote the same or different materials.

Figure 1:
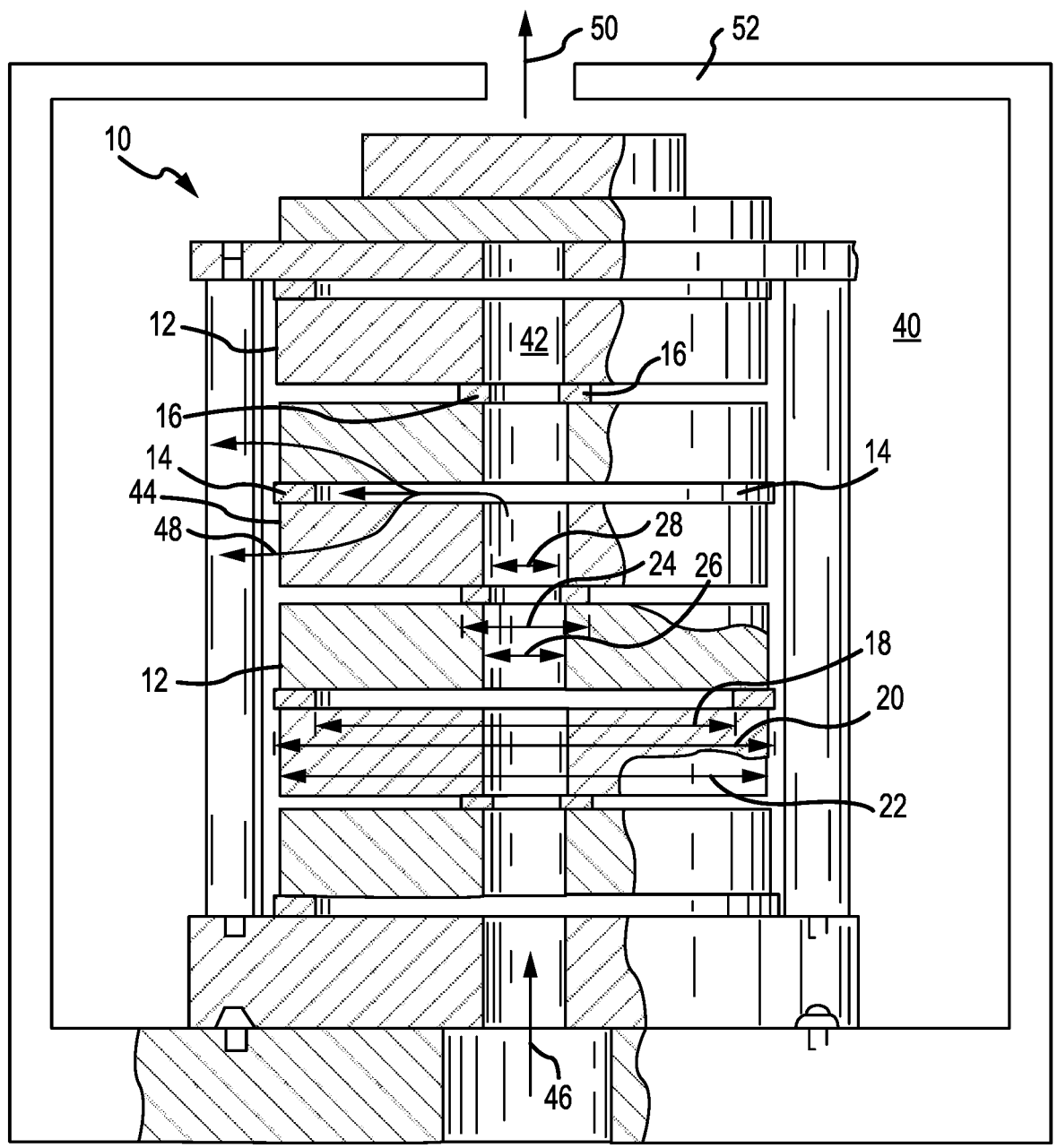
- FIG. 1 illustrates a CVI vessel densifying a stack of porous materials, in accordance with various embodiments.

Referring to FIG. 1, an exemplary fixture 10 in a chemical vapor infiltration (CVI) vessel is shown for pressure gradient CVI in a stack of porous structures 12, in accordance with various embodiments. Porous structures 12 may have "OD" (outside diameter) seal plates 14 disposed around the outside diameter of porous structures 12. Porous structures 12 may also have "ID" (inside diameter) seal plates 16 disposed around the inside diameter of porous structures 12. The OD seal plates 14 may have an inside diameter 18 slightly less than the porous structure outside diameter 22, and an outside diameter 20 that may be generally coterminous with the porous structure outside diameter 44. The ID seal plates 16 may have an outside diameter 24 slightly greater than the porous structure inside diameter 26, and an inside diameter 28 that may be generally coterminous with the porous structure inside diameter 26. With ID seal plates 16, the porous structure outside diameter 22 may be greater than said outside diameter 24 of the ring like ID seal plate 16. Seal plate 14 and seal plate 16 may be disposed between porous structures 12 to provide spacing.

In various embodiments, seal plates 14 and seal plates 16 may provide sealing between external volume 40 and internal volume 42. A pressure gradient may be maintained between external volume 40 and internal volume 42 to encourage gas 46 to travel from internal volume 42 through porous structures 12. Gas 48 moves through porous structures 12 from internal volume 42 to external volume 40 and exits from vessel 52. As gas 48 moves through porous structures 12, gas deposits may densify porous structures 12.

Figure 2:
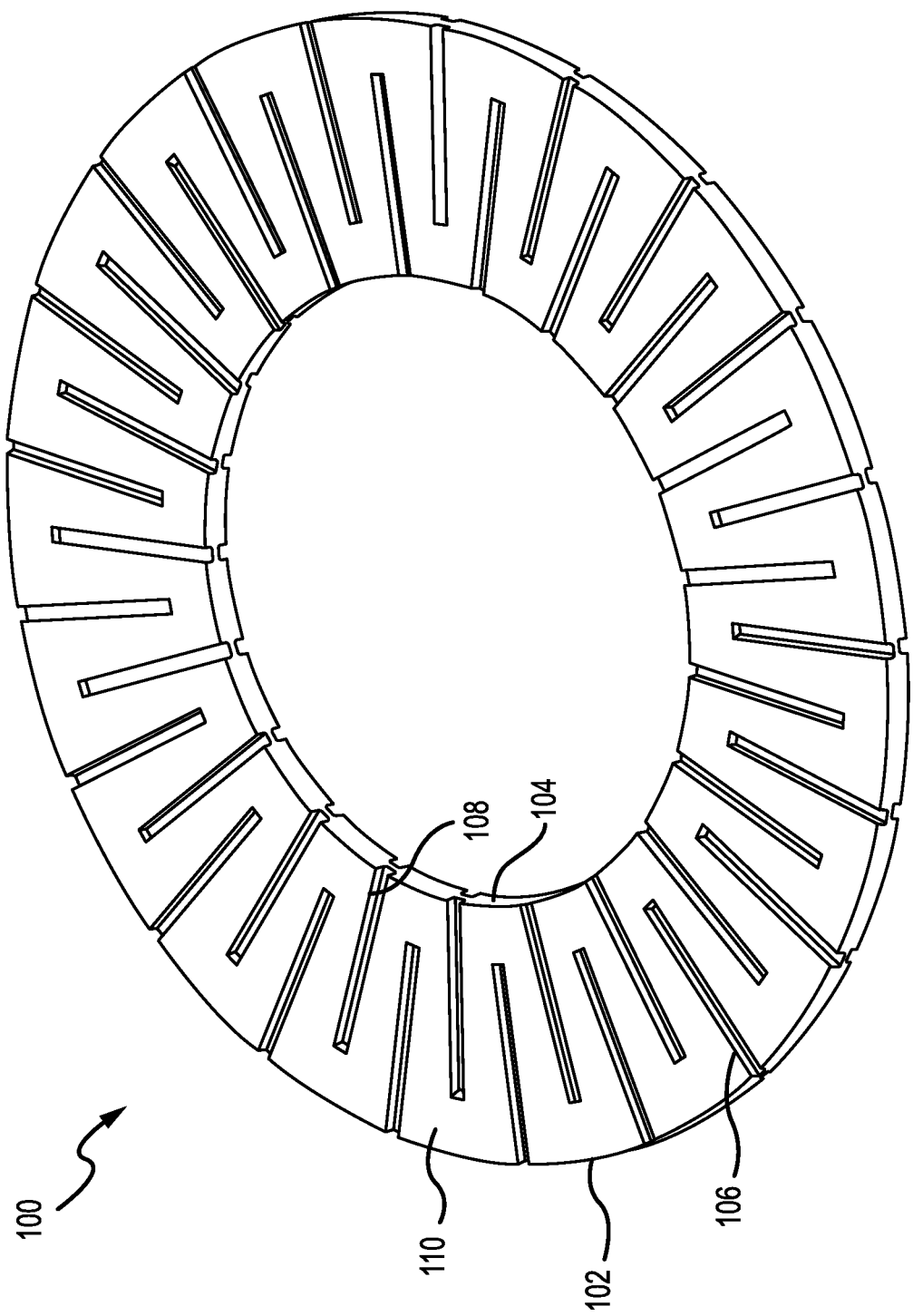
FIG. 2 illustrates an annular seal comprising channels formed partially through the seal in both radial and axial directions, in accordance with various embodiments.

With reference to FIG. 2, a seal plate 100 is shown, in accordance with various embodiments. Seal plate 100 may have an annular geometry with outer surface 102 (also referred to herein as outer diameter). Seal plate 100 may also have an inner surface 104 (also referred to herein as an inner diameter). Entrance channels 108 and exit channels 106 may be formed partially through an axial thickness of seal plate 100. Although entrance channels 108 and exit channels 106 are labeled "entry" and "exit" the gas flow direction may be reversed by reversing the direction of the pressure gradient, in which case gas would exit from entrance channels 108 and enter into exit channels 106.

In various embodiments, entrance channels 108 may be equally spaced about inner diameter 104 of seal plate 100 in a circumferential direction. Exit channels 106 may also be equally spaced about outer diameter 102 in a circumferential direction. Exit channels 106 may extend only partially across seal plate 100 in a radial direction to prevent forming an open gas path from inner diameter 104 to outer diameter 102. Similarly, entrance channels 108 may be formed only partially across seal plate 100 in the radial direction. As used herein, "only partially" across or through a surface may describe a channel formed in a surface of a seal or preform that either opens to an outer diameter and terminates in the surface or opens to an inner diameter and terminates in the surface. As used herein, a radial direction may be in a direction of a radius of a circular part, such as a seal or preform, or more generally a direction moving from an inner diameter towards an outer diameter or from an outer diameter towards an inner diameter.

In various embodiments, entrance channels 108 and exit channels 106 extending only partially through seal plate 100 in a radial direction enable a pressure gradient densification. Entrance channels 108 and exit channels 106 may not be formed completely across seal plate 100 in a radial direction as channels completely across seal plate 100 may tend to equalize a pressure gradient from inner diameter 104 to outer diameter 102. Seal plate 100 may comprise exit channels 106 and entrance channels 108 formed in a top surface 110, a bottom surface opposite the top surface, or both.

Figure 3:
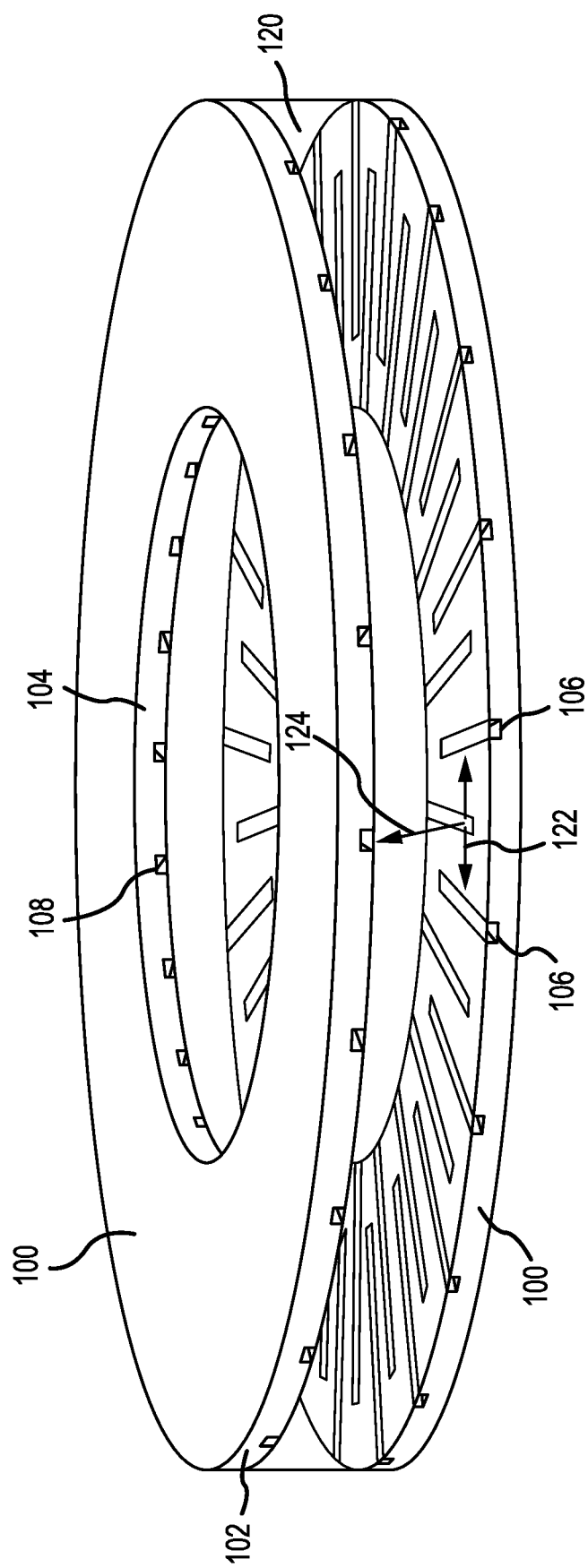
FIG. 3 illustrates gas dispersing from channels in a seal through an annular preform; in accordance with various embodiments.

With reference to FIG. 3, two seal plates 100 are shown with preform 120 between seal plates 100 for CVI densification, in accordance with various embodiments. Preform 120 may be a fibrous part such as a brake part for an aircraft. Seal plates may comprise exit channels 106 starting at outer diameter 102 and entrance channels 108 starting at inner diameter 104 to provide spacing from preform 120. Preform 120 may be a porous structure.

The porous structure (i.e., preform 120) may comprise at least one of carbon, silicon carbide, silicon nitride, boron carbide, aluminum nitride, titanium nitride, boron nitride, zirconia, SiCxNy (wherein x is a number in the range from about zero to about 1, and y is a number in the range from about zero to about 4/3), silica, alumina, titania (TiO2), and a combination of at least two of the foregoing. Prior to densification, the porous structure may be referred to as a preform. A preform for use in making a carbon/carbon composite, such as a carbon/carbon disk brake, may be referred to as a carbonized preform.

As used herein, the term "porous structure" may be interchangeable with "porous structure system." A porous structure system may comprise one or more porous structures that are associated. For example, a porous structure system may comprise two porous structures coupled so that there is contact between each porous structure, such as in a "stack." A porous structure system may comprise three or four porous structures positioned so that at least two of the component porous structures are in contact with each other. For example, a porous structure system may comprise four porous structures positioned in a stack formation. Porous structures may be formed using one or more unbounded and/or separate layers and consolidating the layers into one continuous part during CVI. In that regard, seal plates 100 with channels may be pressed onto separate layers and the layers may be bonded together by the CVI process.

A porous structure may comprise any porous structure derived from a fibrous material such as carbon fibers, silicon carbide fibers, and the like. The carbon fibers may be derived from polyacrylonitrile, rayon (synthetic fiber derived from cellulose), pitch, and the like. The fibrous material may be in the form of a woven, braided or knitted fabric or a needled felt. The fibrous material may be in the form of chopped carbon fibers molded to form a preform. Prior to the densification process, the fibrous material may be formed into a preform having any desired shape or form.

The porous structure may be in the form of a disk having any shape such as, for example, a polygon, a cylinder, a triangle, square, rectangle, pentagon, hexagon, octagon, and the like. In addition, the porous structure may have an irregular form.

A pressure differential between inner diameter 104 and outer diameter 102 may urge gas through the fibrous material and subsequently deposit carbon material in the fibrous material. Gas may pass from inner diameter 104 into entrance channel 108. Gas in entrance channel 108 may move through the fibrous material of preform 120. Gas 124 may travel through an axial thickness of preform 120 towards an exit channel 106 and towards outer diameter 102. Gas 122 may move between entrance channel 108 and adjacent exit channel 106 in a circumferential direction.

The exit channels 106 and entrance channels 108 formed in seal plate 100 may expose an increased surface area of preform 120. Gas may enter preform 120 through surfaces of entrance channel 108 as well as through inner diameter of preform 120. Gas may also exit preform 120 through exit channels 106 as well as outer diameter of preform 120. The increased external surface area of preform 120 exposed to gas may provide advantageous densification speed and uniformity.

Figure 4:
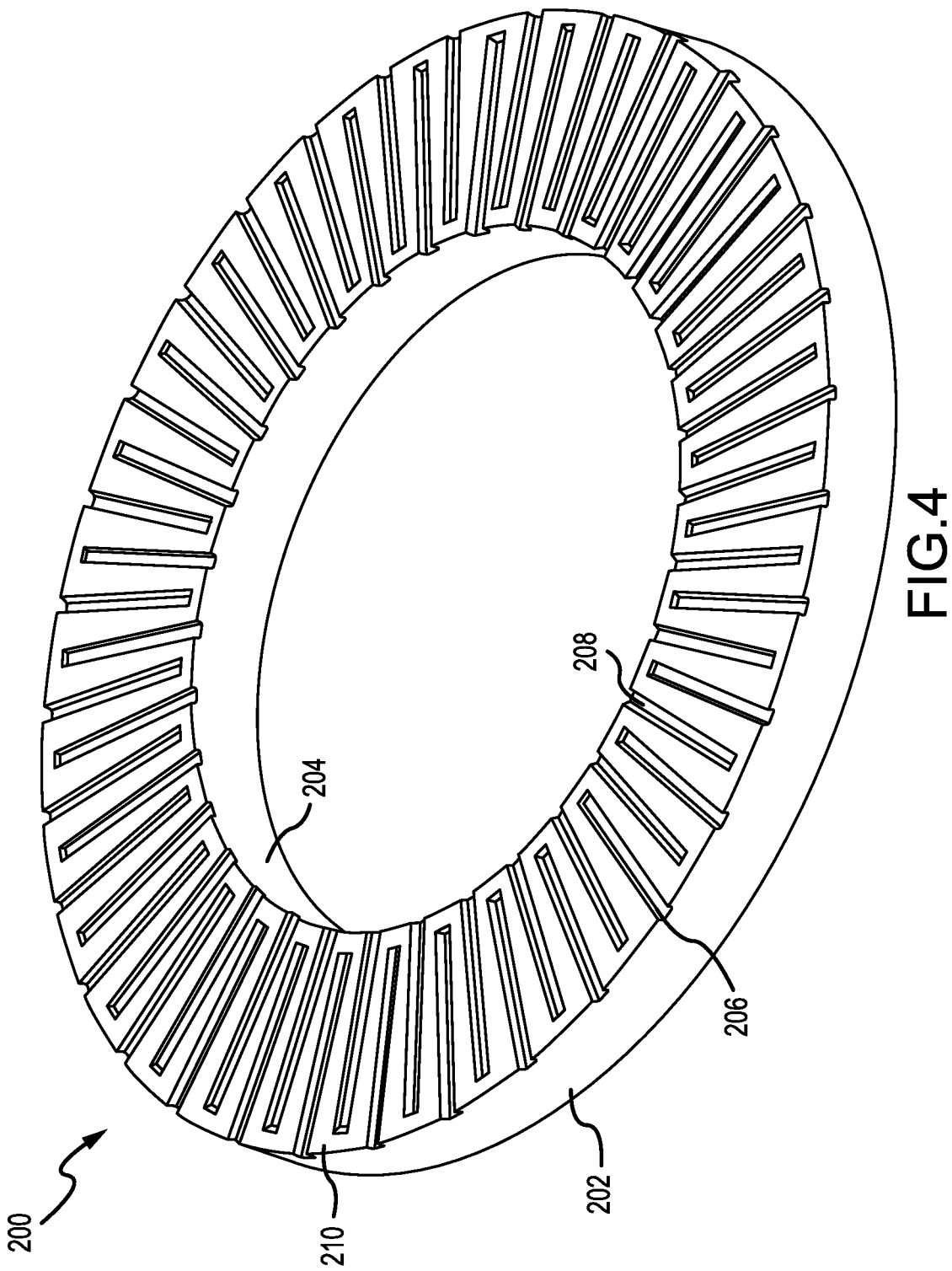
FIG. 4 illustrates an annular preform having channels formed partially through the preform in both radial and axial directions, in accordance with various embodiments.

With reference to FIG. 4, a preform 200 is shown (similar to preform 120 of FIG. 3), in accordance with various embodiments. Preform 200 may have entrance channels 208 and exit channels 206 formed in surface 210. With brief reference to FIG. 2, entrance channels 208 and exit channels 206 may be similar in geometry and orientation to entrance channels 108 and exit channels 106 of seal plate 100. The fibrous material of preform 200 may be a porous structure, as described above with reference to FIG. 3. Entrance channels 208 and exit channels 206 may be formed by applying pressure to preform 200 by depressing a mold or fixture having negative channels to act as a stamp. Entrance channels 208 may extend radially outward from inner diameter 204 and partially across surface 210 in a radial direction. Similarly, exit channels 206 may extend radially inward from outer diameter 202 and extend partially across surface 210. Entrance channels 208 and exit channels 206 extending only partially through preform 200 in a radial direction enable a pressure gradient densification. Entrance channels 208 and exit channels 206 may not be formed completely across preform 200 in a radial direction as channels completely across preform 200 may tend to equalize a pressure gradient from inner diameter 204 to outer diameter 202.

Figure 5C:
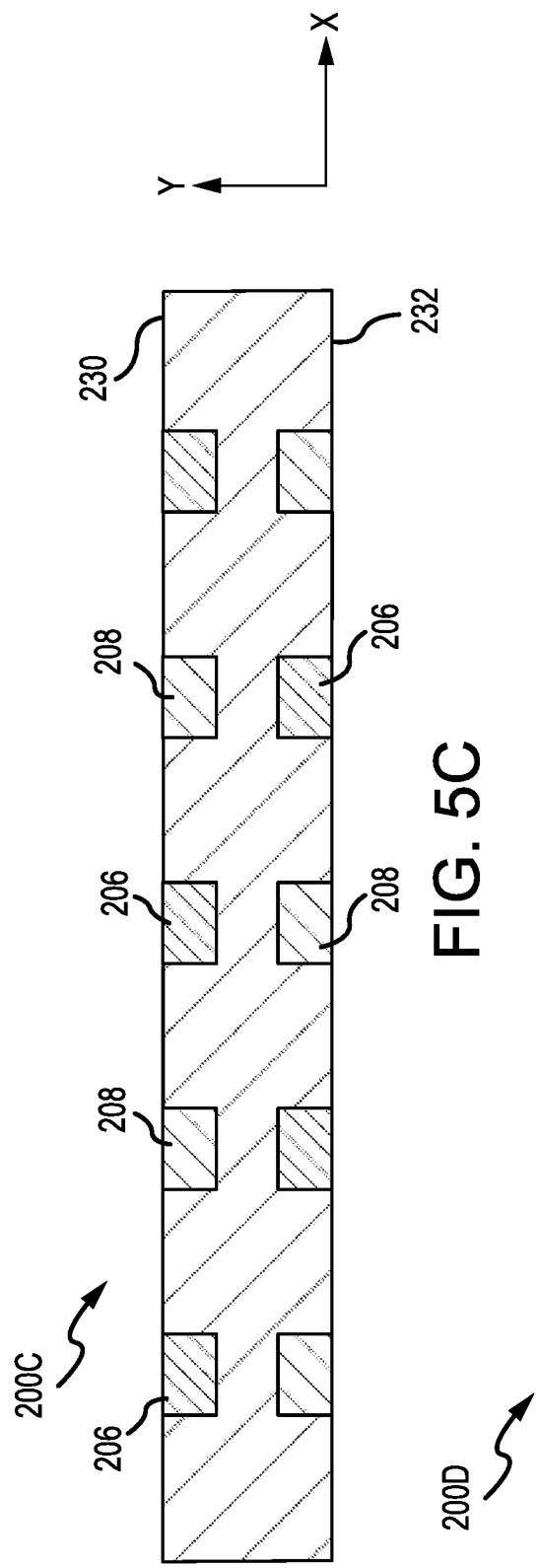
FIG. 5C illustrates a channel arrangement with entry channels aligned with exit channels in an axial direction, in accordance with various embodiments.

With reference to FIGS. 5A-5D, exemplary orientations of entrance channels 208 and exit channels 206 are shown, in accordance with various embodiments. In FIG. 5A, exit channels 206 are formed in surface 230 of preform 200A and entrance channels 208 are formed in surface 232 of preform 200A. Entrance channels 208 are offset from exit channels 206 in an x direction (on the xy axis provided for ease of illustration). The depth (in the y direction) of entrance channels 208 and exit channels 206 as well as the distance (in the x direction) between entrance channels 208 and exit channels 206 may be selected to optimize gas flow from entrance channel 208 to exit channel 206.

With reference to FIG. 5B, exit channels 206 and entrance channels 208 are formed in both surface 230 and surface 232 of preform 200B. Entrance channels 208 in surface 232 are formed axially adjacent (i.e., in the y direction) to an entrance channel 208 formed in surface 230. Similarly, exit channels 206 in surface 232 are formed axially adjacent to an exit channel 206 formed in surface 230. In that regard, an exit channel 206 may be disposed between two entrance channels 208. Similarly, an entrance channel 208 may be disposed between two exit channels 206. The depth (in the y direction) of entrance channels 208 and exit channels 206 as well as the distance (in the x direction) between entrance channels 208 and exit channels 206 may be selected to optimize gas flow from entrance channel 208 to exit channel 206.

With reference to FIG. 5C, exit channels 206 and entrance channels 208 are formed in both surface 230 and surface 232 of preform 200C. Entrance channels 208 in surface 232 are formed axially adjacent (i.e., in the y direction) to an exit channel 206 formed in surface 232. Similarly, exit channels 206 in surface 232 are formed axially adjacent to an entrance channel 208 formed in surface 230. The depth (in the y direction) of entrance channels 208 and exit channels 206 as well as the distance (in the x direction) between entrance channels 208 and exit channels 206 may be selected to optimize gas flow from entrance channel 208 to exit channel 206.

Figure 5D:
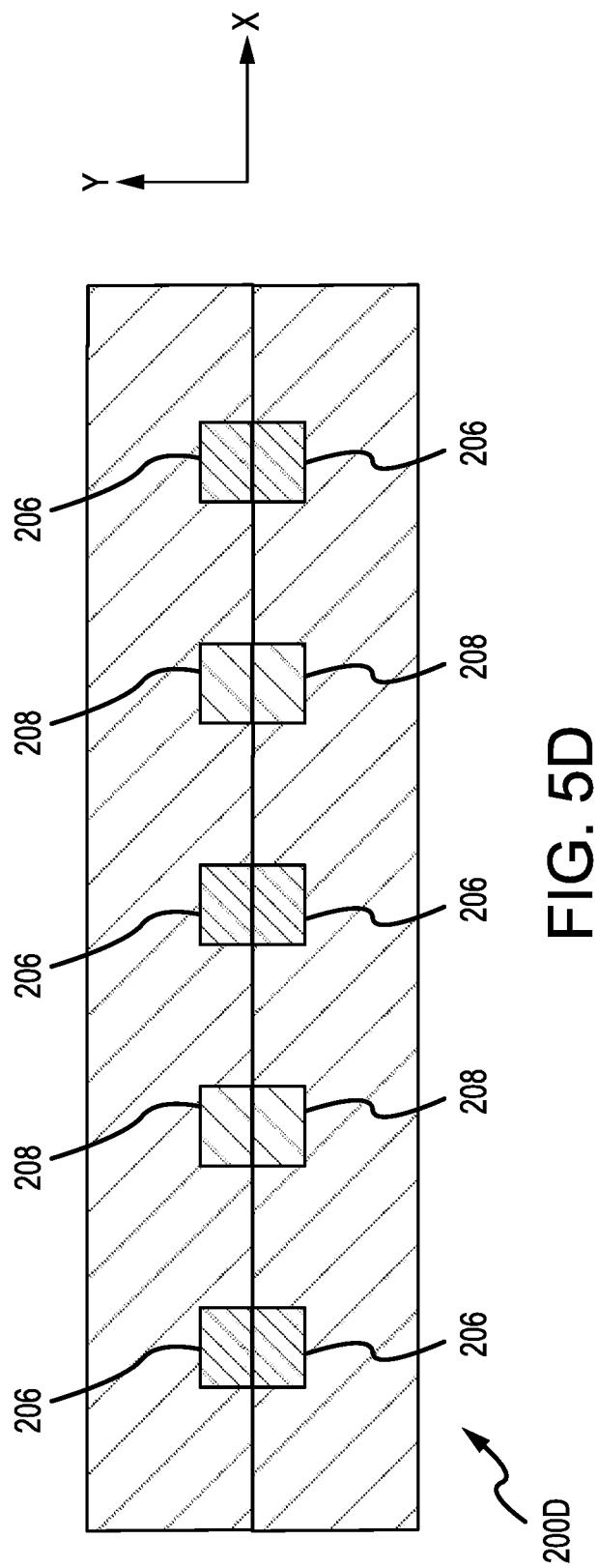
FIG. 5D illustrates stacked preforms having entry channels aligned with adjacent entry channels and exit channels aligned with adjacent exit channels, in accordance with various embodiments.

With reference to FIG. 5D, stacked preforms 200D are shown, in accordance with various embodiments. Stacked preforms 200D have exit channels 206 aligned with adjacent exit channels 206 (i.e., adjacent in the y direction). Stacked preforms 200D also have entrance channels 208 aligned with adjacent entrance channels 208 (i.e., adjacent in the y direction). Aligned exit channels 206 and aligned entrance channels 208 enable a pressure gradient from inner diameter of preform 200D to outer diameter of preforms 200D. Exit channel 206 may also be staggered relative to entrance channel 208. Exit channel 206 may not be aligned with entrance channel 208 in the y direction to avoid forming a direct gas path that does not go through fibrous material from inner diameter to outer diameter of preform 200D.

Figure 6:
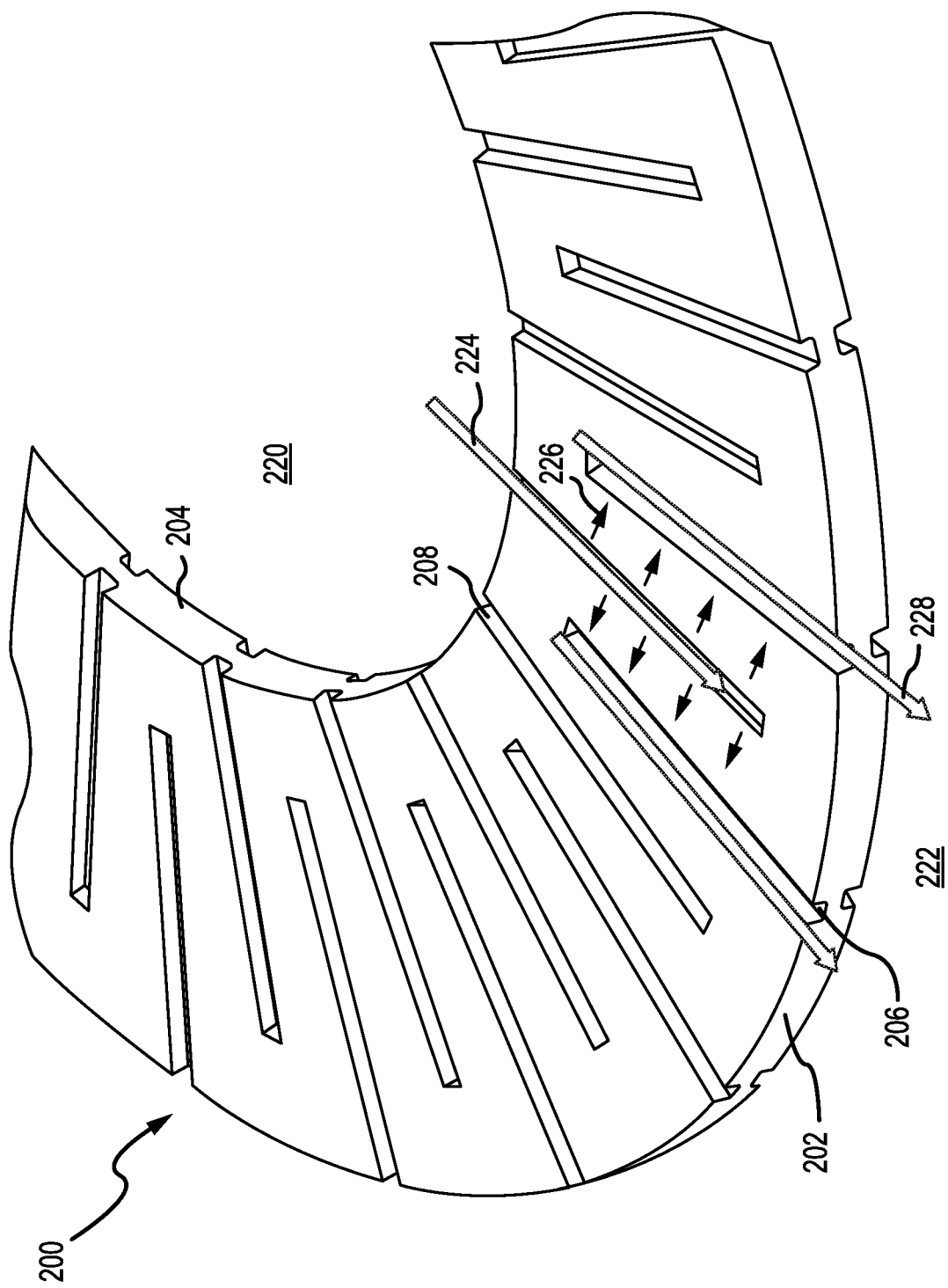
FIG. 6 illustrates the flow of gas through an annular preform starting from an entrance channel and exiting through an exit channel, in accordance with various embodiments.

With reference to FIG. 6, gas is shown flowing through the fibrous material of preform 200, in accordance with various embodiments. An inner volume 220 may supply pressurized gas for CVI in preform 200. Inner volume may be raised to a higher pressure than outer volume 222 to create a pressure gradient between inner volume 220 and outer volume 222. The pressure gradient may drive gas 224 into entrance channel 208. Gas may fill entrance channel 208 and diffuse laterally and radially into fibrous material of preform 200 in a direction generally moving from inner diameter 204 to outer diameter 202. A portion of gas 226 may diffuse laterally from entrance channel 208, through fibrous material of preform 200, and into exit channel 206. Gas 228 may then exit preform 200 via exit channel 206.

In various embodiments, multiple preforms 200 may be stacked in a vessel for CVI without spacers between the preforms. Preforms in a stack without spacers may be aligned having entrance channels 208 in a surface of a first preform staggered from exit channels 206 in a surface of a second preform that contacts the surface the first preform. Staggering the channels tends to prevent a direct gas path (i.e., without passing through fibrous material of preform 200) from inner volume 220 to outer volume 222. Preforms in a stack may have entrance channels 208 of the preforms aligned and exit channels 206 of the preforms aligned without forming a direct gas path from inner volume 220 to outer volume 222. Stacked preforms 200 directly contacting one another may conserve volume in a CVI vessel to enable a greater number of preforms 200 to fit into the vessel compared to stacked preforms 200 with spacers between preforms 200.

In various embodiments, the pressure gradient CVI of the present disclosure may be carried out at an elevated temperature. The elevated temperatures may be uneven and controlled so that a temperature gradient is created. A temperature gradient may vary the rate of deposition during the CVI process to further improve uniformity of the deposition. The pressure gradient CVI may be carried out with a ratio of per-minute gas flow to preform volume greater than or equal to 1.5 (also referred to as high-flow CVI). For example, if 15,000 cubic centimeters (915 cubic inches) of gas were flowing per minute over a 10,000 cubic centimeter (610 cubic inches) then part the ratio of per-minute gas flow to preform volume would be 1.5. The higher ratios of per-minute gas flow to preform volume may accelerate the densification process due to the increased area in which gas can escape through the part. The increased surface area provided by entrance channels 208 and exit channels 206 may enable high-flow CVI with improved uniformity of deposition and increase the rate of densification. Additionally, increased volume and area that is exposed to the pressure gradient may further enhance densification at high flow rates.

Benefits and other advantages have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, and any elements that may cause any benefit or advantage to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of making a fibrous part, comprising:
   placing a composite part having an annular geometry into a chemical vapor infiltration (CVI) vessel; and
   placing a seal plate over the composite part, wherein the seal plate comprises an entrance channel formed in a surface of the seal plate and extending in a radial direction from an inner diameter of the seal plate only partially across the surface, wherein the seal plate comprises an exit channel formed in the surface of the seal plate and extending in the radial direction from an outer diameter of the seal plate only partially across the surface.

2. The method of claim 1, further comprising densifying the composite part using a pressure gradient chemical vapor infiltration process.

3. The method of claim 1, further comprising urging a gas into the entrance channel, through the composite part, and out the exit channel.

4. The method of claim 1, further comprising using a high-flow chemical infiltration process to densify the composite part.

5. The method of claim 1, further comprising using a thermal gradient chemical deposition process to densify the composite part.

6. The method of claim 1, further comprising placing a second composite part in the CVI vessel with the seal plate between the composite part and the second composite part.

\* \* \* \* \*